US012153233B1

(12) United States Patent
Xin et al.

(10) Patent No.: US 12,153,233 B1
(45) Date of Patent: Nov. 26, 2024

(54) ELECTRONIC DEVICE WITH STACKED METASURFACE LENSES

(71) Applicant: Apple Inc., Cupertino, CA (US)

(72) Inventors: Xiaobin Xin, Herndon, VA (US); Dmitry S. Sizov, Cupertino, CA (US); Fang Ou, San Jose, CA (US); Lei Zhang, Albuquerque, NM (US); Lina He, San Jose, CA (US); Nathaniel T. Lawrence, San Francisco, CA (US); Paul S. Drzaic, Morgan Hill, CA (US); Ranojoy Bose, Fremont, CA (US); Yuewei Zhang, Santa Barbara, CA (US)

( * ) Notice: Subject to any disclaimer, the term of this patent is extended or adjusted under 35 U.S.C. 154(b) by 592 days.

(21) Appl. No.: 17/465,458

(22) Filed: Sep. 2, 2021

Related U.S. Application Data

(60) Provisional application No. 63/082,965, filed on Sep. 24, 2020.

(51) Int. Cl.
  *G02B 5/18* (2006.01)
  *H01L 27/15* (2006.01)
  *H01L 31/0232* (2014.01)
  *H01L 33/58* (2010.01)

(52) U.S. Cl.
  CPC ......... *G02B 5/1814* (2013.01); *G02B 5/1809* (2013.01); *H01L 27/156* (2013.01); *H01L 31/0232* (2013.01); *H01L 33/58* (2013.01)

(58) Field of Classification Search
  CPC ... G02B 5/1814; G02B 5/1809; H01L 27/156; H01L 31/0232; H01L 33/58
  See application file for complete search history.

(56) References Cited

U.S. PATENT DOCUMENTS

| | | | |
|---|---|---|---|
| 9,151,891 B2 | 10/2015 | Ma et al. | |
| 10,408,419 B2 | 9/2019 | Aieta et al. | |
| 10,634,557 B2 | 4/2020 | Khorasaninejad et al. | |
| 10,656,012 B2 | 5/2020 | Atabaki et al. | |
| 11,181,775 B2 * | 11/2021 | You | H10K 59/13 |
| 2019/0377067 A1 * | 12/2019 | Han | G01S 7/4815 |
| 2020/0081294 A1 | 3/2020 | You et al. | |
| 2020/0284960 A1 * | 9/2020 | Ellenbogen | G02B 5/20 |

FOREIGN PATENT DOCUMENTS

WO    2019133572 A1    7/2019

* cited by examiner

*Primary Examiner* — Mustak Choudhury
(74) *Attorney, Agent, or Firm* — Treyz Law Group, P.C.; G. Victor Treyz; Jinie M. Guihan

(57) ABSTRACT

Optical components such as components that emit light and components that detect light may be provided. Optical components that emit light may include displays having arrays of display pixels with respective light-emitting devices such as crystalline semiconductor light-emitting diodes. Optical components that detect light may include image sensors or other components with arrays of photodetectors. The light-emitting devices and photodetectors in the optical components may be overlapped by metalenses such as multielement metalenses. A multielement metalens may have a first metalens element formed from a first layer of nanostructures arranged and an overlapping second metalens element formed from a second layer of nanostructures. Light sources may be provided on a semiconductor and metalens nanostructures may be formed on an opposing surface of the semiconductor.

25 Claims, 15 Drawing Sheets

ELECTRONIC DEVICE WITH STACKED METASURFACE LENSES

This application claims the benefit of provisional patent application No. 63/082,965, filed Sep. 24, 2020, which is hereby incorporated by reference herein in its entirety.

FIELD

This relates generally to electronic devices, and, more particularly, to electronic devices with optical components.

BACKGROUND

Electronic devices often have optical components. Optical components such as displays are used to present images to a user. Optical components such as image sensors detect light.

SUMMARY

Optical components such as components that emit light and components that detect light may be provided for an electronic device. The optical components that emit light may include displays having arrays of display pixels with respective light-emitting devices such as crystalline semiconductor light-emitting diodes. The optical components that detect light may include image sensors or other components with arrays of photodetectors.

The light-emitting devices and photodetectors in the optical components may be overlapped by respective lenses. The lenses may be metalenses. In a light-emitting component such as a display, light from each display pixel may be collimated using the metalens in that pixel. In a light-detecting component such as an image sensor, light being sensed by each image sensor pixel may be focused onto the photodetector of that pixel using the metalens in the pixel.

The metalenses may be multielement metalenses. A multielement metalens may have a first metalens element formed from a first layer of nanostructures and a second metalens element formed from a second layer of nanostructures. The lens elements may be spaced apart in the vertical dimension and may be aligned with each other and overlap in the horizontal dimensions (e.g., the footprints of the lens elements may overlap when viewed from above). Light sources may be provided on a semiconductor surface and metalens nanostructures may be formed on an opposing surface of the semiconductor.

DETAILED DESCRIPTION

Figure 1:
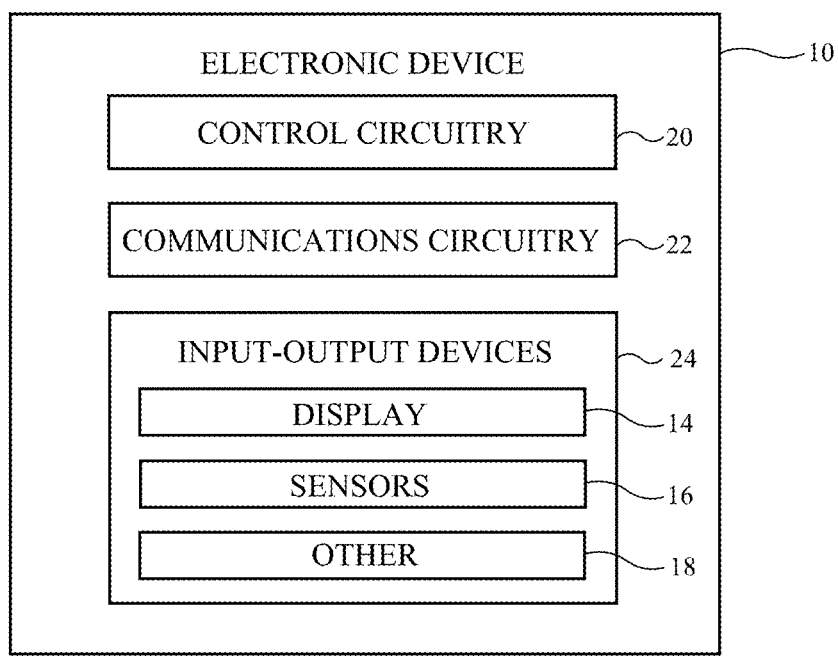
FIG. 1 is a schematic diagram of an illustrative electronic device in accordance with an embodiment.

Electronic devices may be provided with optical components. The optical components may include components that emit light such as displays and may include components that receive light such as photodetectors.

Displays may be used for displaying images for users. Displays may be formed from arrays of light-emitting diode pixels. The light-emitting diode pixels may be formed from thin-film organic light-emitting diodes or crystalline semiconductor light-emitting diodes. To help narrow the cone of light emitted by each pixel and thereby enhance the amount of light directed towards a viewer, the pixels may be overlapped by lenses. For example, a display may have a pixel array in which each display pixel of the array is overlapped by a respective lens.

Optical sensors may be formed from photodetectors in arrays (e.g., optical sensors may include image sensors and/or other optical sensors with arrays of light detectors). Optical sensors may have lenses that help gather light. As an example, an optical sensor such as an image sensor may have an array of image sensor pixels with respective photodetectors each of which is overlapped by a respective lens that focuses incoming light onto the photodetector of that image sensor pixel.

The lenses in an optical component may be formed using metasurfaces. Metasurface lenses, which may sometimes be referred to as metalenses, may, for example, overlap pixels in a display or light-detectors in an optical sensor.

A metasurface has an array of optical elements configured to control the phase, amplitude and polarization of light passing through the metasurface. The optical elements in a metasurface, which may sometimes be referred to as nanostructures, may have subwavelength dimensions and subwavelength pitch. As an example, a metasurface for a lens that is configured to operate at visible light wavelengths (e.g., wavelengths from 380 to 740 nm) may have lateral dimensions and a nanostructure element-to-element pitch (sometimes referred to as nanostructure pitch) of less than 0.3 microns, less than 0.2 microns, less than 0.15 microns, 0.05-0.3 microns, less than 0.4 microns, or other suitable subwavelength size). A metasurface lens configured to operate at blue light wavelengths may, as an example, have lateral dimensions and a nanostructure pitch of 200-250 nm. Metasurface lenses configured to operate at infrared wavelengths may have larger dimensions and nanostructure pitches (e.g., 0.5 microns).

Thin transparent pillars of material or other optical elements may be used in forming a metasurface. These metasurface structures, which may sometimes be referred to as nanostructures, may be formed from dielectric material or semiconductor material that is transparent at wavelengths of interest may be formed using lithographic patterning techniques, nano-imprinting, and/or other fabrication techniques. Examples of dielectric material that may be used in forming nanostructures for metalenses include organic materials (e.g., polymer) and inorganic materials (e.g., oxides such as titanium oxide, silicon oxide, aluminum oxide, niobium oxide, etc.). Some metal oxides may have relatively high refractive index values (e.g., 2.5 for titanium oxide, 2.1 for niobium oxide, etc.). Other inorganic materials may have lower refractive index values (e.g., 2-2.2 for silicon nitride). Even lower refractive index values (e.g., 1.45-1.5) may be achieved using polymers or inorganic materials such as silicon oxide. Examples of semiconductor material that may be used in forming nanostructures for metalenses include silicon and compound semiconductors such as InAlGaP (e.g., when handling red light), InGaN (e.g., when handling blue, green, and red light), and InP (e.g., for infrared wavelengths). The refractive index for semiconductors may be, e.g., 2.4-3.5.

In an illustrative configuration, which is sometimes described herein as an example, each metasurface lens may have a stack of two or more metasurface lens elements. For example, each metalens may have a first metalens formed from a first layer of nanostructures and may have a second metalens formed from a second layer of nanostructures that overlaps the first layer of nanostructures.

Optical components with arrays of multielement metalenses may be thinner and/or may exhibit enhanced performance relative to optical components with other lens designs. For example, a display with an array of multielement metalenses may use the multielement metalenses to efficiently collimate light emitted by each pixel of the display while maintaining a desired fine pixel pitch for the display pixels. An image sensor with an array of multielement metalenses may use the multielement metalenses to help enhance image sensor pixel efficiency.

An illustrative electronic device of the type that may incorporate optical components with multielement metalenses is shown schematically in FIG. 1. Illustrative electronic device 10 of FIG. 1 may be a cellular telephone, tablet computer, laptop computer, wristwatch device, head-mounted device, or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs) or other crystalline semiconductor light-emitting diodes, and/or other display. Configurations in which display 14 is an organic light-emitting diode display are sometimes described herein as an example.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2A:
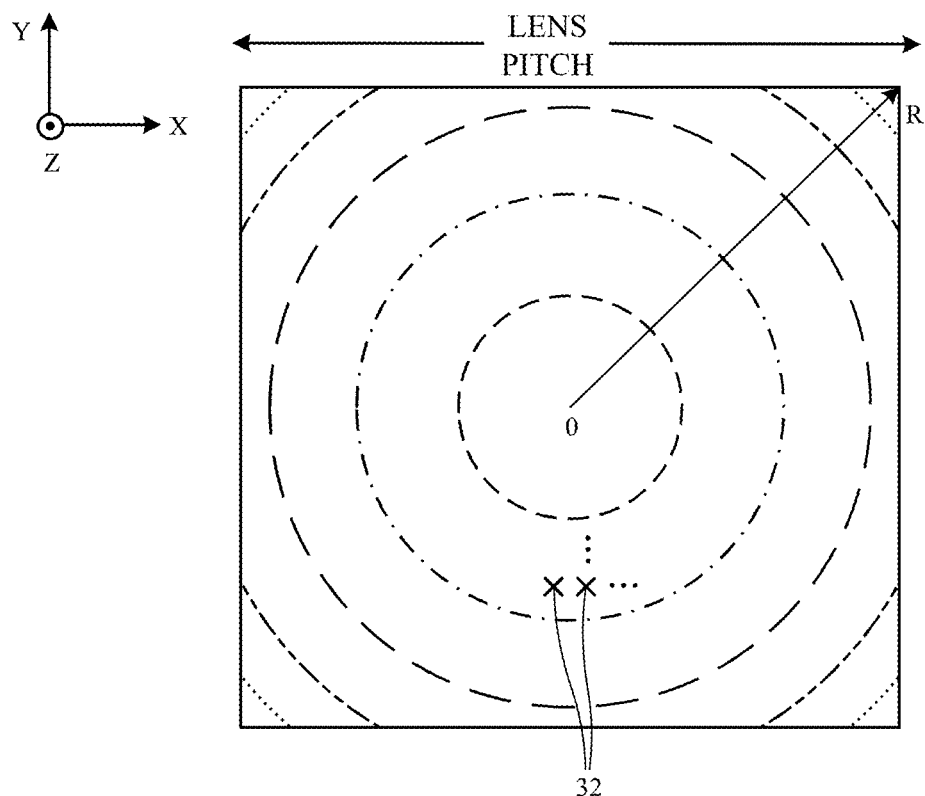
FIG. 2A is a top view of an illustrative metasurface having an array of nanostructures for forming a metalens in accordance with an embodiment.

Metalenses for optical components in device 10 may have multiple metalens elements each of which is formed from a respective layer of nanostructures. A top view of a portion of an illustrative nanostructure layer for forming a metalens element is shown in FIG. 2A. As shown in FIG. 2A, a layer of nanostructures 32 may be organized in an array (e.g., an array in the XY plane of FIG. 2A). Nanostructures 32, which may sometimes be referred to as optical elements or light-scattering structures may have lateral dimension (in the XY plane) of less than a wavelength of light. For example, if metalens 30 operates at a wavelength λ, the lateral dimensions of nanostructures 32 may be 10-40% of λ or less (as examples). The nanostructure pitch of nanostructures 32 (e.g., the center-to-center spacing of nanostructures 32) may similarly be subwavelength in size to avoid grating effects that could diffract light passing through nanostructures 32. Configurations in which ring-shaped structures (e.g., ring-shaped structures having subwavelength widths) are used in forming lenses for optical components in device 10 may also be used.

Nanostructures 32 may be formed from dielectric, semiconductor, and/or other materials transparent to light at the operating wavelengths of interest for the metalens. As an example, an array of metal oxide fins (e.g. titanium dioxide fins) may be formed on a dielectric substrate and this array of metal oxide fins may be planarized by covering the fins with a layer of polymer having a lower refractive index than the metal oxide of the fins. Other nanostructures may be used in forming metalenses if desired.

Figure 2B:
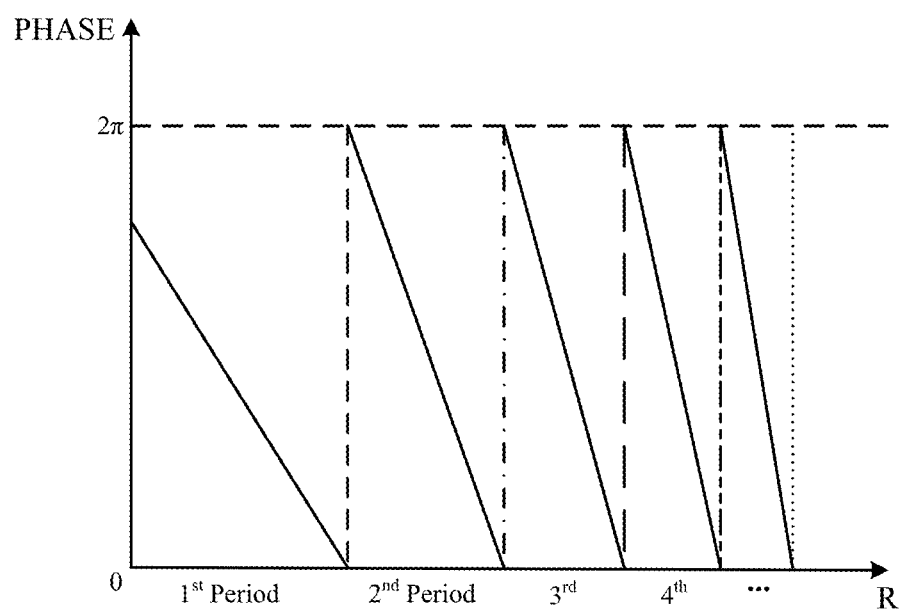
FIG. 2B is a graph in which phase change has been plotted as a function of radial distance R in the lens of FIG. 2A in accordance with an embodiment.

The lens shown in FIG. 2A may have a rectangular (e.g. square) outline and may be formed in an array with an associated lens pitch (sometimes referred to as pixel pitch). The array of lenses may, for example, overlap a corresponding array of display pixels or sensor pixels. Nanostructures 32 may be patterned to produce desired phase changes for light passing through the lens (e.g., phase changes that cause the nanostructures to form a lens element of a desired focal length). The graph of FIG. 2B shows an illustrative phase change that may be exhibited for light traveling through the lens of FIG. 2A as a function of radial distance R from the center of the lens of FIG. 2A.

Figure 2C:
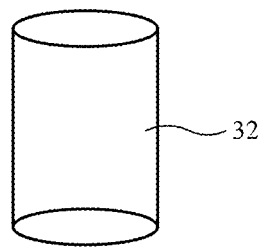
FIG. 2C is a perspective view of an illustrative cylindrical pillar nanostructure in accordance with an embodiment.
Figure 2D:
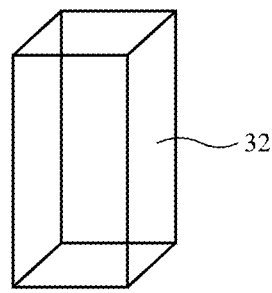
FIG. 2D is a perspective view of an illustrative rectangular pillar nanostructure in accordance with an embodiment.
Figure 2E:
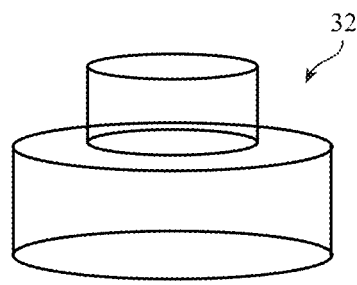
FIG. 2E is perspective view of an illustrative multilayer nanostructure in accordance with an embodiment.

Nanostructures 32 may have any suitable shape. For example, nanostructures 32 may be cylinders (e.g., posts with circular outlines as shown in FIG. 2C), may be posts with rectangular outlines as shown by nanostructure 32 of FIG. 2D, may be rings with different profiles to form a metalens (or, if desired a Fresnel lens), etc. Each nanostructure 32 may form a separate column of height H and/or nanostructures 32 may have staircase cross-sectional profiles. For example, nanostructures 32 may each have multiple heights along the Z axis as shown by illustrative multilayer nanostructure 32 of FIG. 2E. This type of arrangement may be used, for example, to reduce the aspect ratio of each layer of the nanostructure. The value of height H of a given nanostructure be, as an example, 0.5-10 times the lateral dimensions of the nanostructure, more than 2 times the lateral dimensions of the nanostructure, less than 20 times the lateral dimensions of the nanostructure, etc.). Nanostructures 32 may be aligned so that their edges run parallel to the X and Y axes of FIG. 2 and/or may be angled at non-zero angles with respect to the X and Y axes. As an example, the angular orientation of nanostructures 32 may vary as a function of position within a metalens.

By varying the size and shape of nanostructures 32, the nanostructure pitch of nanostructures 32, the angular orientation of nanostructures 32, the material of nanostructures 32, and/or other nanostructure characteristics as a function of position within a nanostructure layer, desired optical properties can be implemented (e.g., nanostructures 32 can be configured to alter the phase, amplitude, and/or polarization of one or more wavelengths of light passing through nanostructures 32 as desired to form a metalens element). In this way, a thin metalens with a desired focal lens, desired polarization properties, and other desired optical properties can be obtained. As an example, nanostructures 32 may, as shown in FIG. 2B, implement a radially varying phase change that forms a lens of a desired focal length.

Figure 2F:
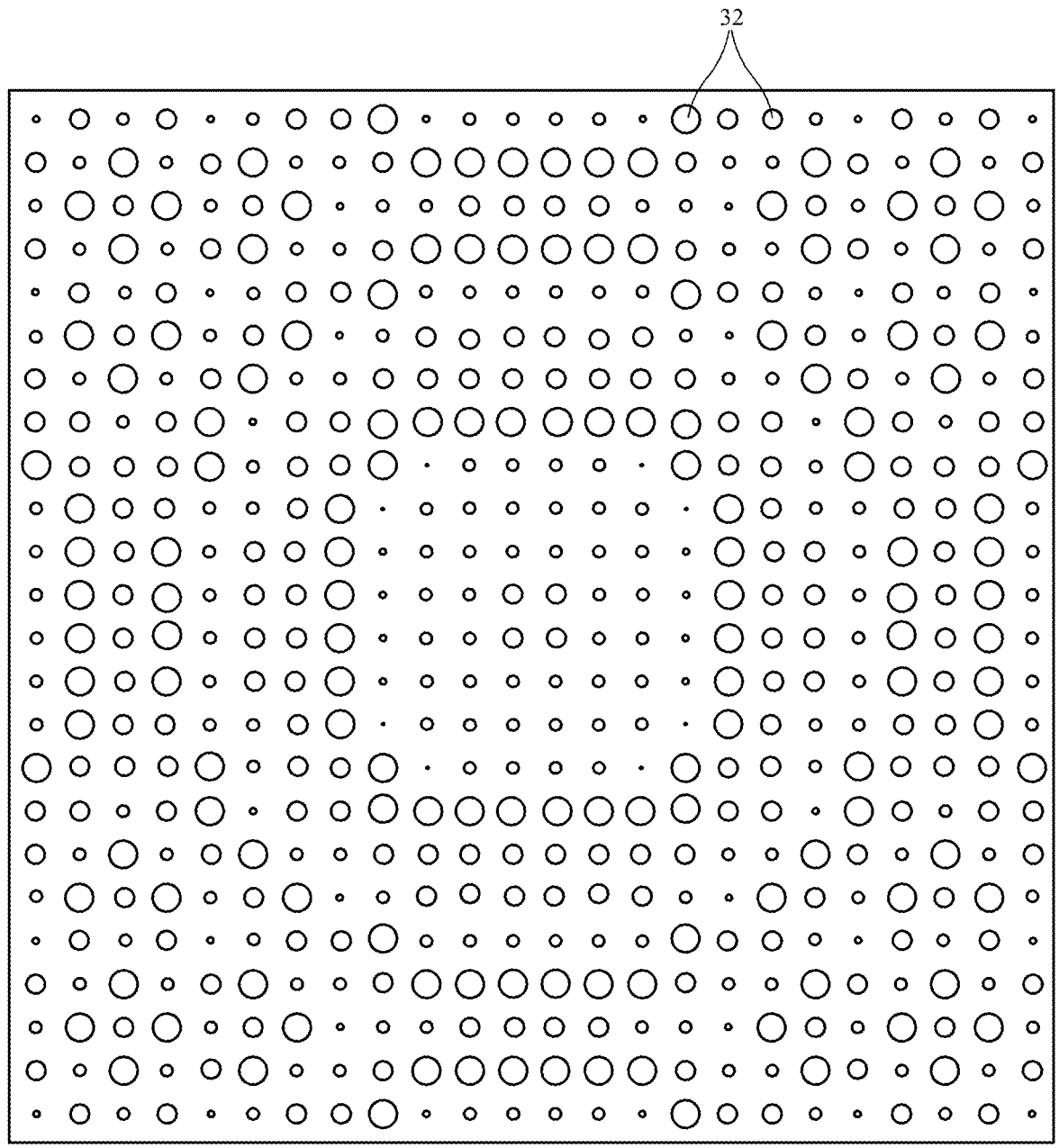
FIG. 2F is a top view of an illustrative metalens in accordance with an embodiment.

A top view of an illustrative metalens formed from an array of nanostructures 32 is shown in FIG. 2F. As shown in FIG. 2F, the metalens may implement a ring-type phase change pattern, where the amount of phase change at each location is determined by the pillar attributes (dimensions, size, shape, etc.) at that location. The pillars may be arranged in a Cartesian array (e.g., pillars may be organized in an array having horizontal rows and vertical columns). Each pillar outline may be circular, square, or other shape that is symmetric in Cartesian coordinates to produce a non-polarized metalens or may have a rectangular outline to produce a polarizing metalens.

Figure 2G:
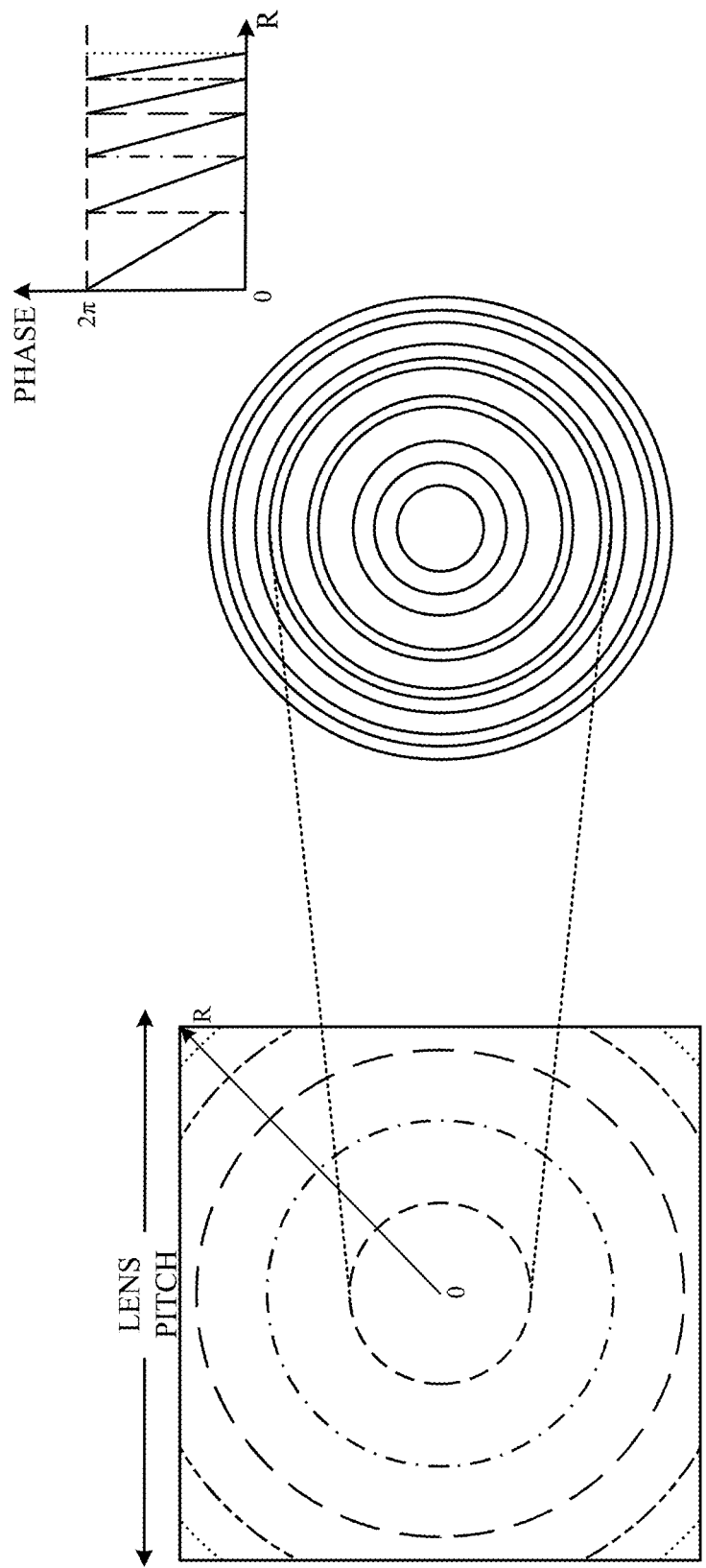
FIG. 2G is a diagram of an illustrative lens configuration with a ring-type phase change and phase controlled by ring width in accordance with an embodiment.

Another illustrative lens configuration is shown in FIG. 2G. With this type of arrangement, a ring-type phase change may be implemented in which phase is controlled by ring width. This type of lens is similar to but not identical to the Fresnel ring lens shown in FIG. 2H. The ring-to-ring spacing (sometimes referred to as ring pitch) between rings in the lens of FIG. 2G may be subwavelength and the phase change within each period may be modulated by ring size. A first phase change from 2η to near 0 is implemented in the center of the lens using rings of a first period. A second phase change from 2π to near zero is implemented in the outer portion of the lens using rings of a second period.

Figure 2H:
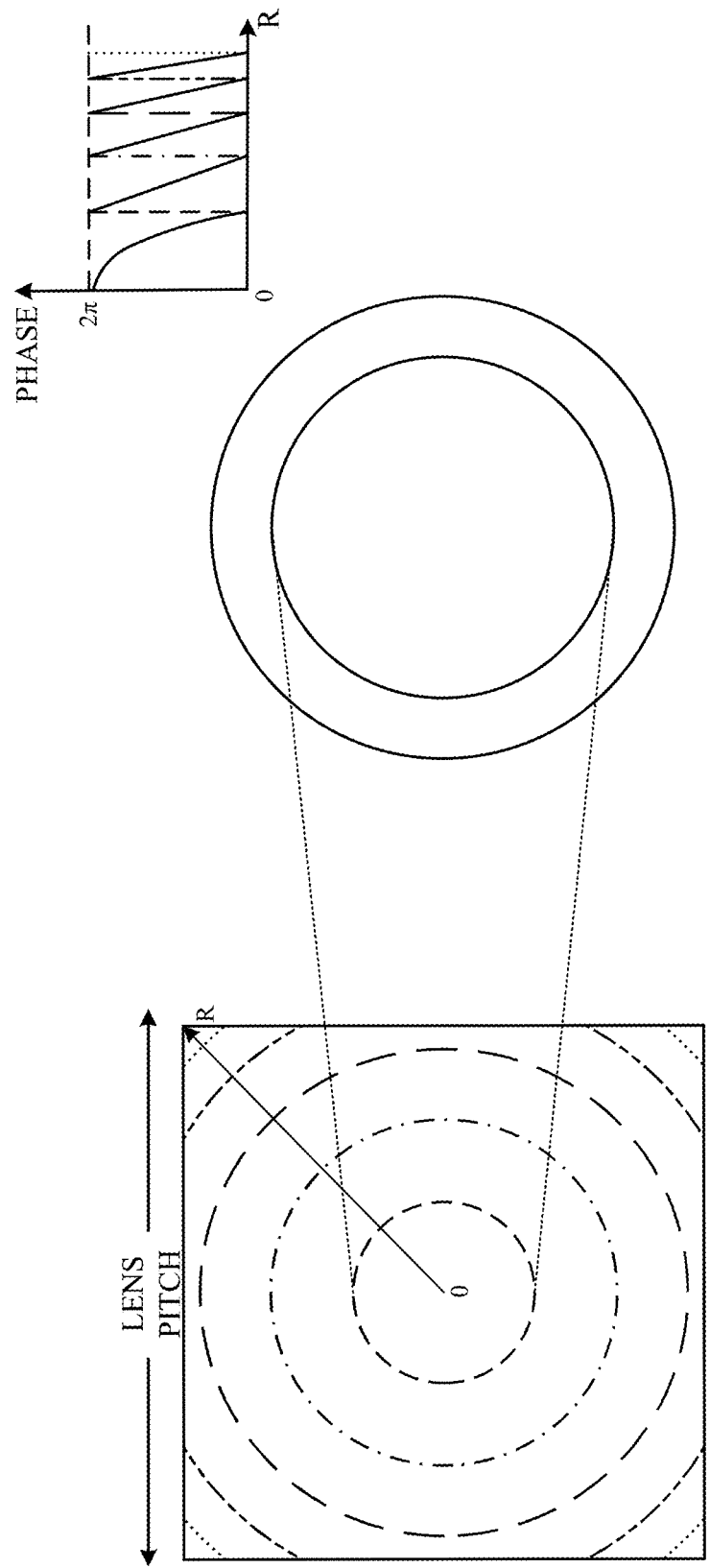
FIG. 2H is a diagram of an illustrative Fresnel lens in accordance with an embodiment.

An illustrative Fresnel lens configuration that may be used in forming a lens element for a stacked lens is shown in FIG. 2H. In the example of FIG. 2H, phase change is controlled by ring width. The phase within each period is modulated by the ring cross-sectional profile. Within the center of the lens of FIG. 2H, the lens exhibits a first 2π phase shift. Further 2π phase shifts may be implemented using concentric rings.

Figure 2I:
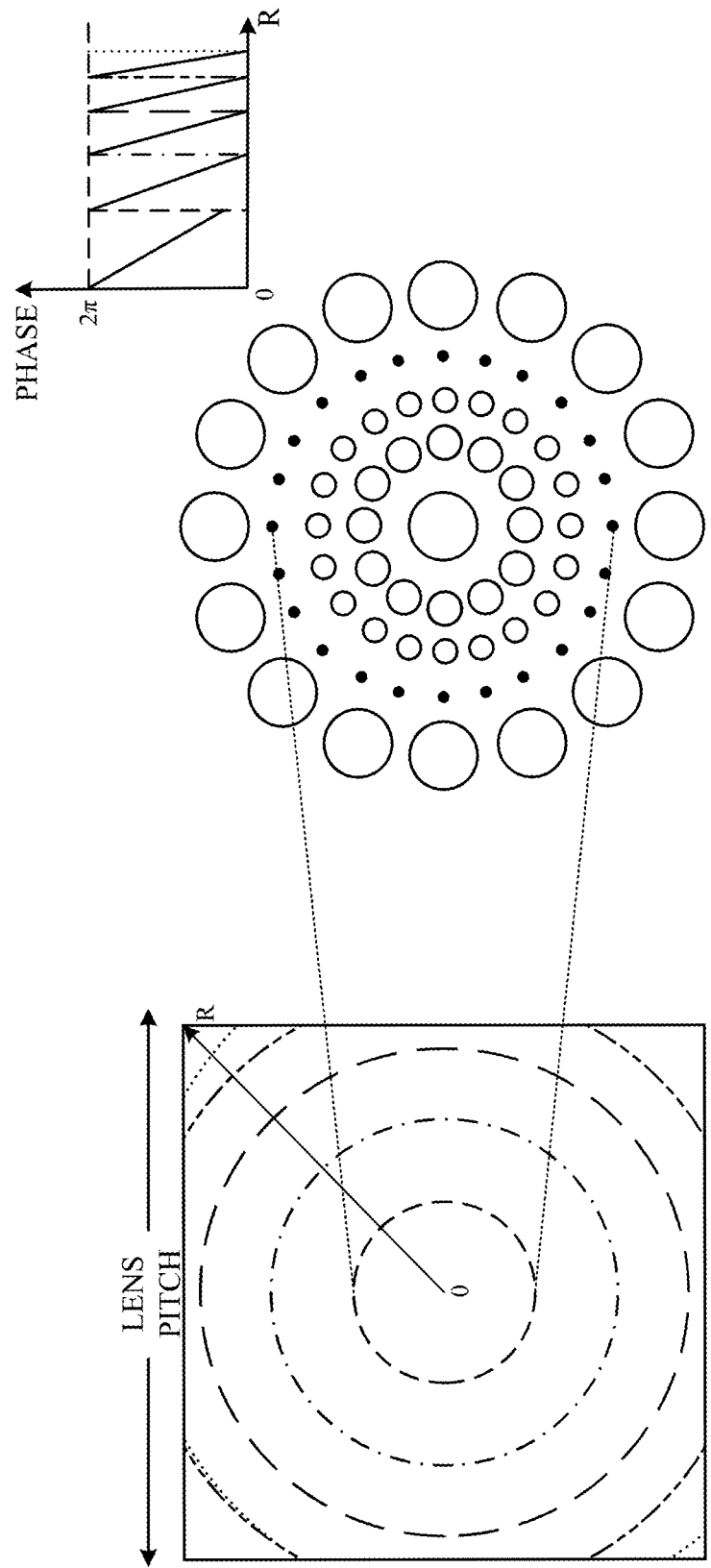
FIG. 2I is a diagram of an illustrative metalens in accordance with an embodiment.

FIG. 2I is a diagram of an illustrative metalens that also exhibits a radially varying phase change. The amount of phase change achieved at each position within the lens is controlled by attributes of the nanostructures at that position (e.g., pillar size change in this example). The nanostructures may be arranged along lines that extend radially from the center of the lens (e.g., pillars may be aligned along polar coordinates). Nanostructures (e.g., pillars) may have a first period within the center of the lens, a second period in a concentric ring surrounding the center of the lens, etc.

Figure 3:
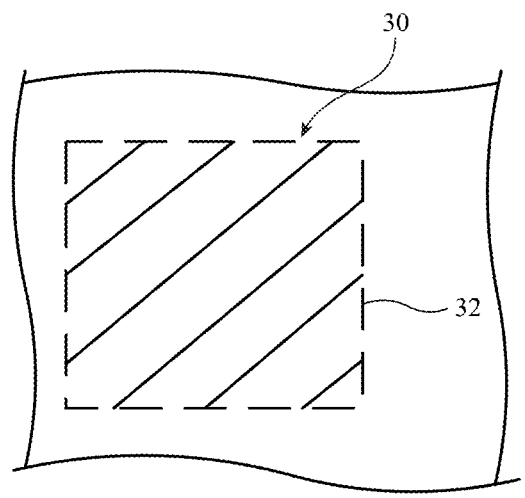
FIG. 3 is a top view of an illustrative metasurface lens without an open center region in accordance with an embodiment.
Figure 4:
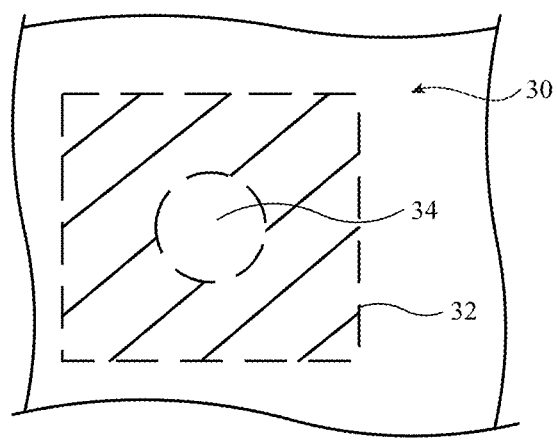
FIG. 4 is a top view of a view of an illustrative ring-shaped metasurface lens having an open center region that is free of nanostructures in accordance with an embodiment.

Metalenses formed from nanostructures 32 may have any suitable shape. In the illustrative configuration of FIG. 3, metalens 30 is formed from a solid disk of nanostructures that has been truncated to form a rectangular outline (e.g., metalens 30 is formed from a solid uninterrupted square of nanostructures 32). In the illustrative configuration of FIG. 4, metalens 30 is formed from a ring of nanostructures. With this type of arrangement, the center of the ring (central region 34) is free of nanostructures. Ring-shaped metalenses such as metalens 30 of FIG. 4 may have rectangular outlines (e.g., square footprints formed by truncating a radially symmetric layer of nanostructures so that the layer of nanostructures has straight orthogonal edges as shown in the solid nanostructure lens element of FIG. 3) or other suitable shapes. The nanostructure-free opening in the center of the ring (region 34) may be circular.

Lenses may be stacked to form stacked multielement lenses. Each multielement lens may overlap a respective optical component (e.g., a display pixel or sensor pixel). For example, metalens elements such as metalens 30 of FIG. 3 and/or metalens 30 of FIG. 4 may be stacked to form multielement metalenses that overlap corresponding arrays of pixels in a display and/or that overlap corresponding arrays of optical detectors in an optical sensor.

Figure 5:
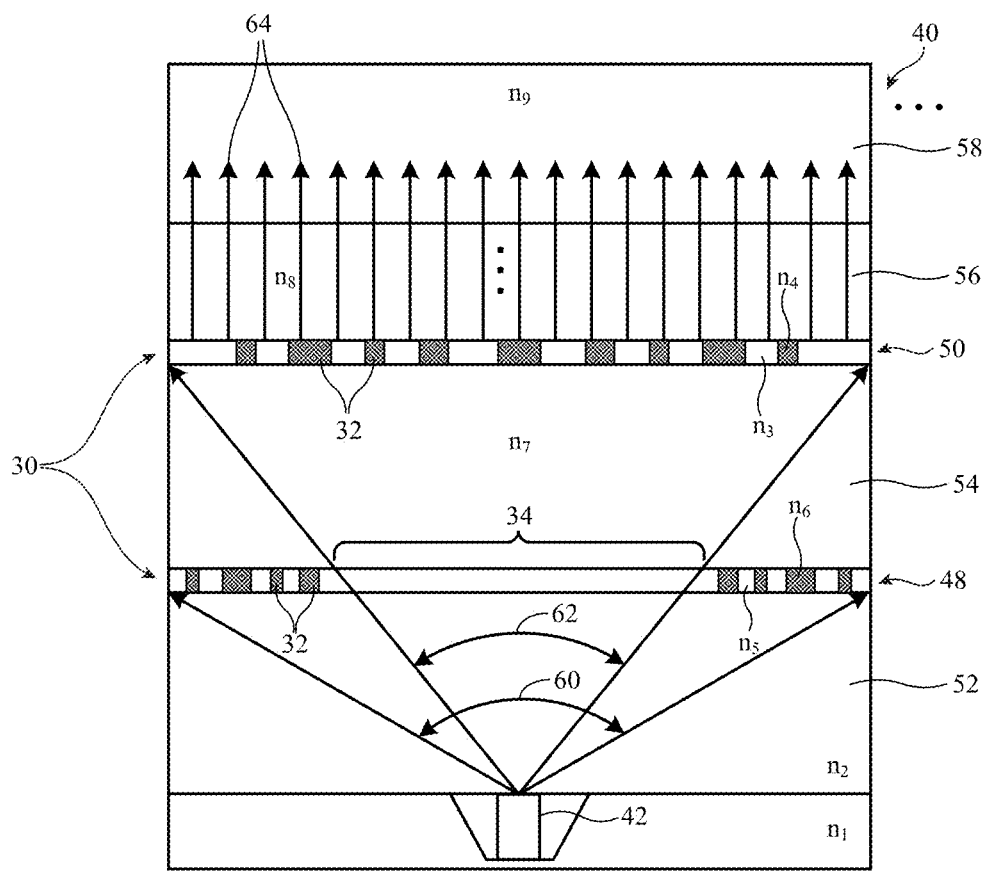
FIGS. 5, 6, 7, 8, 9, 10, and 11 are cross-sectional side views of illustrative metasurface lenses overlapping optical components in accordance with embodiments.

FIG. 5 is a cross-sectional side view of an illustrative optical component having an array of light sources overlapped by respective multielement metalenses. As shown in FIG. 5, optical component 40 may have a light source such as light source 42. Optical component 40 may be, for example, a display having an array of pixels each of which has a respective independently controlled light source such as light source 42.

The pixel pitch of light sources 42 in the display may be, as an example, 10-30 microns, less than 20 microns, or other suitable pixel pitch. Light from light sources 42 may be emitted outwardly through the layers of component 40 as shown by light rays 64. Although shown as being parallel in FIG. 5, rays 64 may diverge slightly (e.g., the emitted light from source 42 may initially have a relatively wide angular spread and may be collimated by lens 30 to form a narrower cone of light rays 64 at the output of layer 56). Light source 42 may be a light-emitting diode or other light-emitting device.

Component 40 has an array of multielement metalenses 30. Each multielement metalens 30 in FIG. 5 has a lower metalens element (metalens) 48 with a ring of nanostructures 32 and has upper metalens element 50 with a disk of nanostructure 32. As shown by metalens element 48 of FIG. 5, central region 34 may be free of nanostructures 32.

The layer of material forming the structures of FIG. 5 may include polymer, inorganic dielectric and/or other materials with one or more refractive index values (e.g., refractive index values n1, n2, n3, n4, n5, n6, n7, n8, and n9). For example, metalens element 48 may have nanostructures 32 of refractive index n6 surrounded by material with a different refractive index n5, whereas overlapping metalens element 50, which is aligned with metalens element 48 may have nanostructures 32 of refractive index n4 surrounded by material with a different refractive index n3. In some configurations, it may be desirable to configure nanostructures 32 so that nanostructure pitch is less than 2*λ/n, less than 1.5*λ/n, or less than λ/n, where λ is the operating wavelength of the metalens and n is the refractive index value of nanostructure 32 or the material interposed between adjacent nanostructures in a metalens (e.g., n5 or n6 in lens element 48, whichever is higher, or n3 or n4 in lens element 50, whichever is higher) or where n is the refractive index of the material overlapping the metalens element (e.g., index n7 for the material overlapping lens element 48 or index n8 for the material overlapping lens element 50).

Light source 42 may be, for example, a quantum well light-emitting diode or other crystalline semiconductor light-emitting diode or an organic light-emitting diode (OLED). Light source 42 may emit incoherent light that is characterized by a finite coherence length L with a finite value comparable to or less than lens pitch or lens dimensions (e.g., 1-3 microns, 2 microns, less than 2 microns, or other suitable value). To avoid creating a situation in which nanostructures 32 are closer to light source 42 than coherence length L, lower metalens may have a ring-shaped layer of nanostructures 32 (e.g., nanostructures 32 may be excluded from region 34, which would be closer to light source 42 than L). The absence of nanostructures in region 34 helps increase the closest distance between light source 42 and nanostructures 32 (e.g., to a distance greater than the coherence length L) without overly increasing the thickness of lens 30 and helps avoid interference between the nanostructures of lens 48 and light source 42. The metalens design of FIG. 5 also avoids placing the nanostructure layers too far from light source 42, which could necessitate overly enlarging the lateral size of the metalens elements and thereby necessitate enlarging the pixel pitch by an undesirable amount.

With the arrangement of FIG. 5, emitted light from light source 42 that lies within cone 62 is collected by lens 50 after passing through the nanostructure-free opening or region 34 in the center of lens 48, whereas emitted light from light source 42 that lies in the outer portion of cone 60 passes through both lens 48 and lens 50.

As light is emitted by light source 42 and passes through lens 30, emitted light travels through the layers of material that make up the structures of FIG. 5 such as layer 52, 54, and 56. Layers 52, 54, and 56 may be, for example, polymer layers or other transparent layers. Layer 52 may serve as a support for the nanostructures of lens 48 and may space lens 48 a desired distance from light source 42. Layer 54 may help establish a desired spacing between lenses 48 and 50 and may support the nanostructures of lens 50. Layer 56 may help protect lens 50. After passing through layer 56, light 64 may be emitted into the material of layer 58 (e.g., air or other material).

In some optical component configurations, light sources 42 of a common color are arranged on separate substrates. For example, display 14 may include a red display formed from red pixels with red light sources 42 overlapped by metalenses 30 configured to collimate red light, may include a green display formed from green pixels with green light sources 42 overlapped by metalenses 30 configured to collimate green light, and may include a blue display formed from blue pixels with blue light sources 42 overlapped by metalenses 30 configured to collimate blue light. With this type of arrangement, an optical combiner system (e.g., prisms, etc.) may be use to merge red, green, and blue images for respective red, green, and blue pixel arrays (each covered with an array of multielement metalenses) to form a full-color image for viewing by a user.

Figure 6:
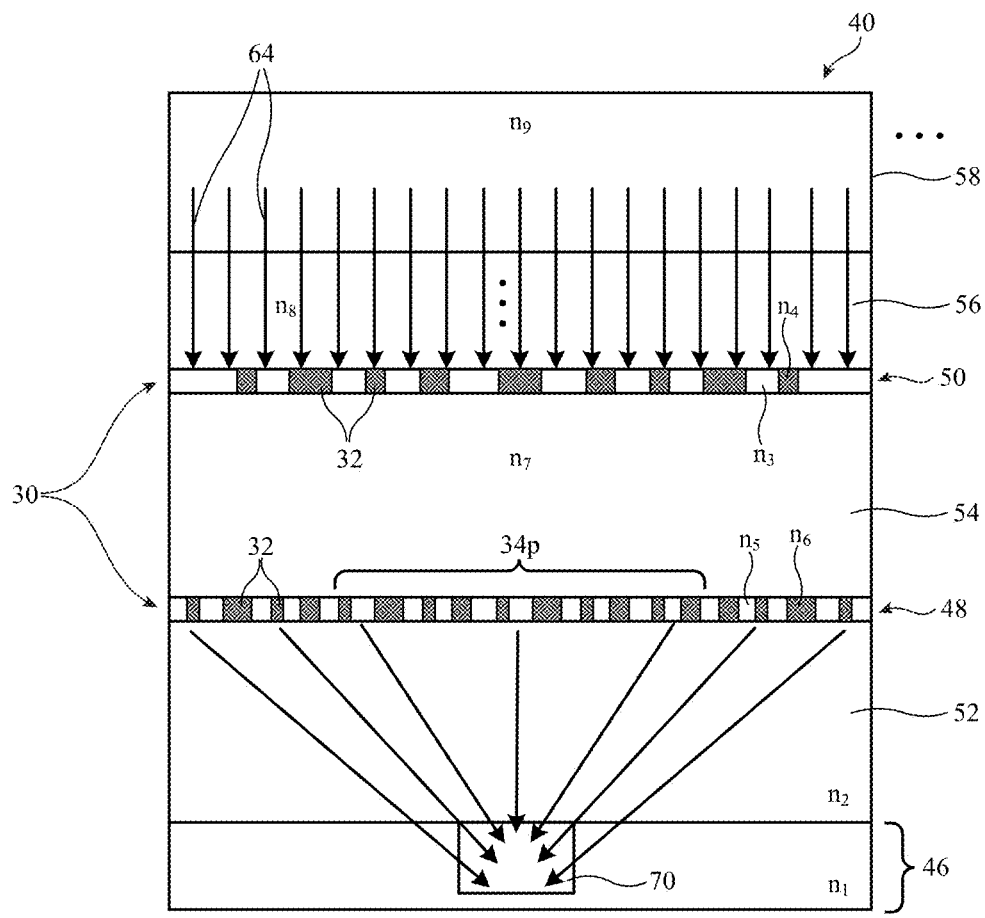

FIG. 6 is a cross-sectional side view of an illustrative optical component (component 40) in an illustrative configuration in which light 64 is being collected and focused onto a light detector. Component 40 may be an optical sensor such as an image sensor having an array of image sensor pixels each of which has a light detector (e.g., one or more photodetectors) for detecting light. As shown in FIG. 6, component 40 may have an array of pixels each of which has a corresponding light detector 70 (e.g., a crystalline semiconductor photodetector) to detect light. Incoming light 64 for each light detector 70 is collected by a corresponding multielement metalens 30, which includes upper lens 50 and lower lens 48. In the FIG. 6 example, central portion 34P of lower lens 48 contains nanostructures 32. Ring-shaped lenses may be used in forming one or more layers in lenses 30 for an image sensor, if desired.

In the examples of FIGS. 5 and 6, a single layer of material (layer 54) is located between lenses 48 and 50. If desired, layer 54 and/or the other layers of FIGS. 5 and 6 (e.g., layer 52 and/or layer 56) may be formed from multiple sublayers of different materials.

Figure 7:
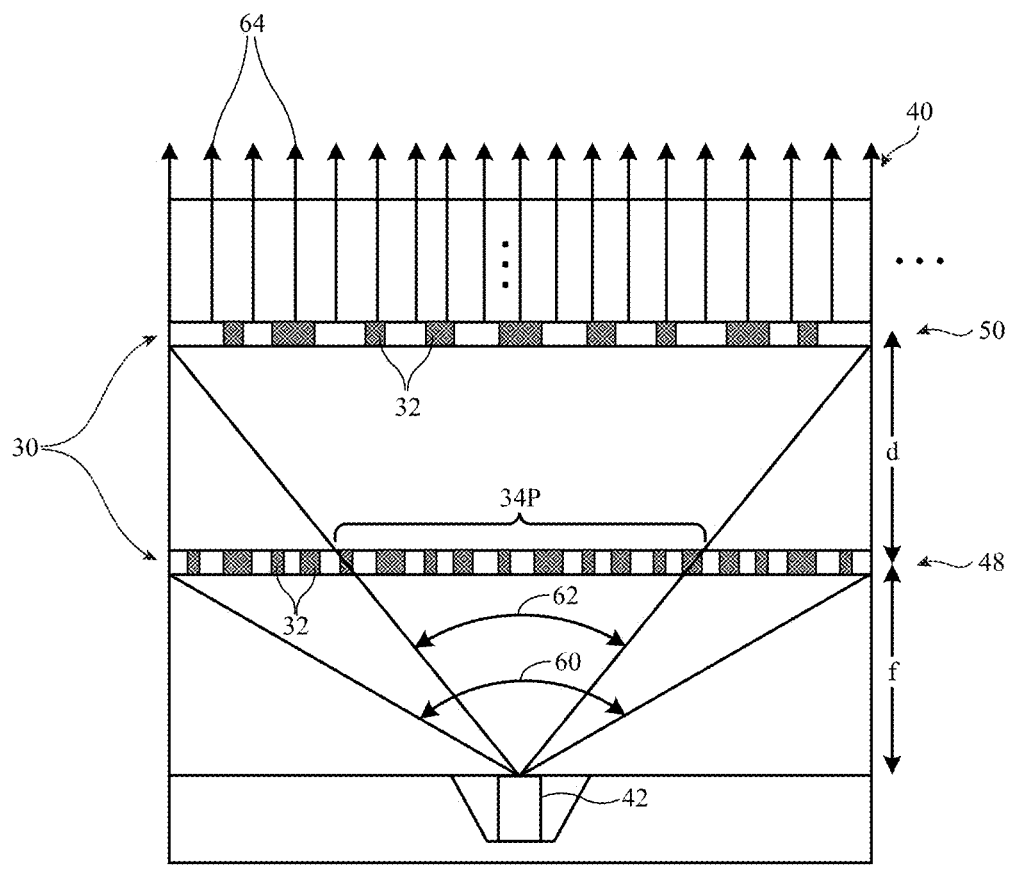
Figure 8:
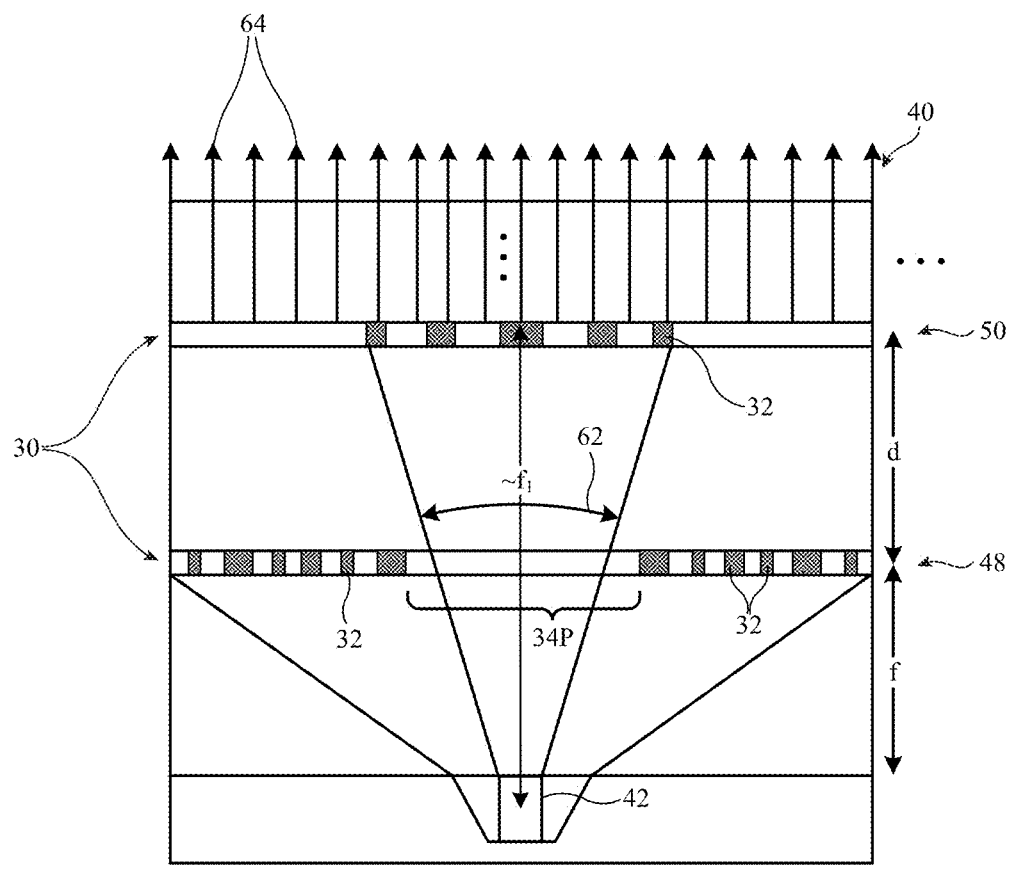

Illustrative alternative designs for lenses 30 are shown in FIGS. 7 and 8. In the example of FIG. 7, light source 42 is overlapped by a lower metalens 48 having a central portion 42P that contains nanostructures 32. In the example of FIG. 8, this central portion is free of nanostructures.

Whether using a ring-shaped lower lens such as lens 48 of FIG. 5 and lens 48 of FIG. 8 or a solid disk-shaped lens such as lens 48 of FIG. 7, the focal lengths of lenses 48 and 50 and the separation d between lenses 48 and 50 may be configured so that light emitted by source 42 is effectively collimated. If, as an example, the focal length of lens 48 is f1 and the focal lens of lens 50 is f2, light source 42 may be placed at a distance f from lens 48, where f is determined by equation 1.

$$f=(f1*f2)/(f1+f2-d) \quad (1)$$

In the examples of FIGS. 5 and 7, lens 50 has circular shape with a diameter that is equal to the diameter of lens 48. If desired, the diameter of lens 50 may be different than the diameter of lens 48. As shown in FIG. 8, for example, lens 50 may have a smaller diameter than that of lens 48 (e.g., a diameter that is slightly larger than the diameter of the nanostructure-free opening in central portion 34P in lens 48 of FIG. 8). With this type of arrangement, light in cone 62 passes through nanostructure 32 in lens 50 and is collimated exclusively by lens 50 of multielement metalens 30, whereas light in cone 60 that falls outside of cone 62 is collimated by nanostructures 32 in lens 48.

If desired, lenses 48 may be formed from nanostructures that are etched into the surface of a layer of semiconductor. The etched surface may, as an example, be the backside surface of a semiconductor layer whose opposing topside surface is used to support light sources 42. Semiconductors tend to have high refractive index values (e.g., 2.2-3.5). The high refractive index of semiconductor structures enables enhanced index contrast with surrounding materials, which can help enhance metalens performance and potentially reduce fabrication complexity. The semiconductor layer(s) from which nanostructures are formed may be a semiconductor substrate or a semiconductor layer such as a semiconductor epitaxial layer on a substrate (e.g., a semiconductor epitaxial buffer layer on which light-emitting diodes are grown or another part of an epitaxial light-emitting-diode film stack). Semiconductor layers or other epitaxial layers grown on a substrate may be situated below the active region of the light-emitting diodes after epitaxial light-emitting diode stack growth.

Figure 9:
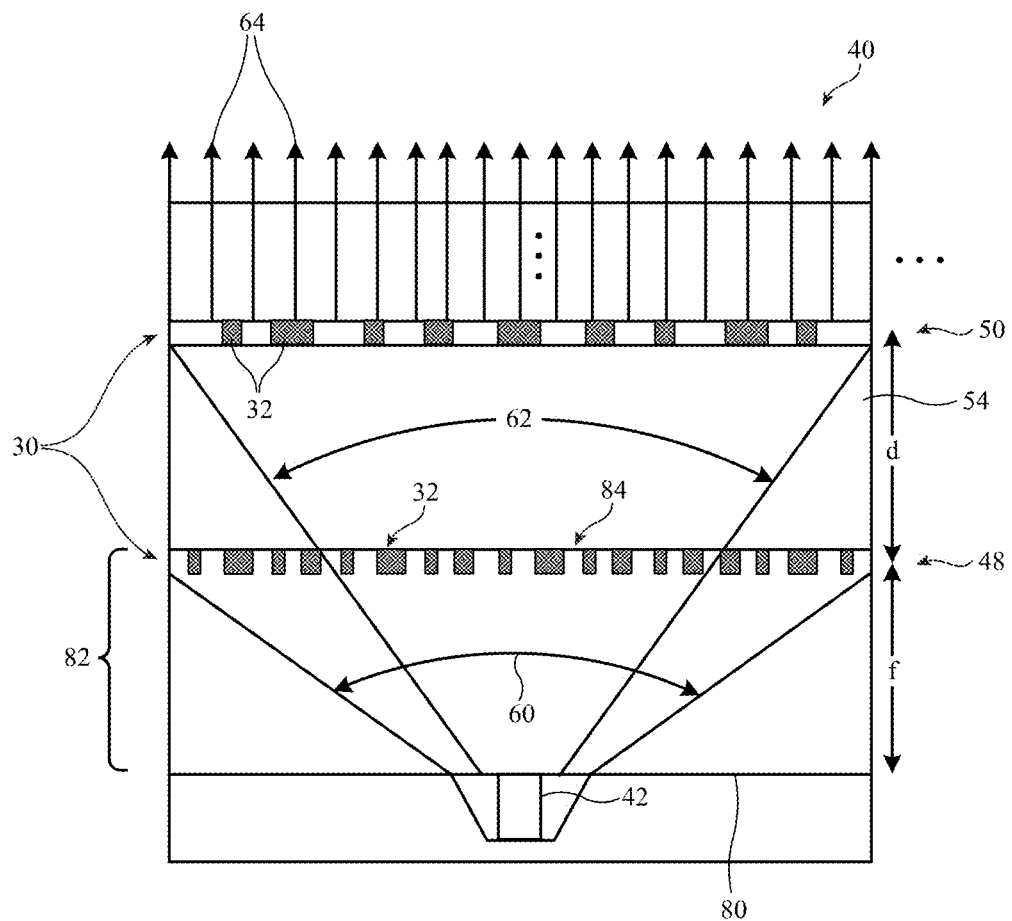
Figure 10:
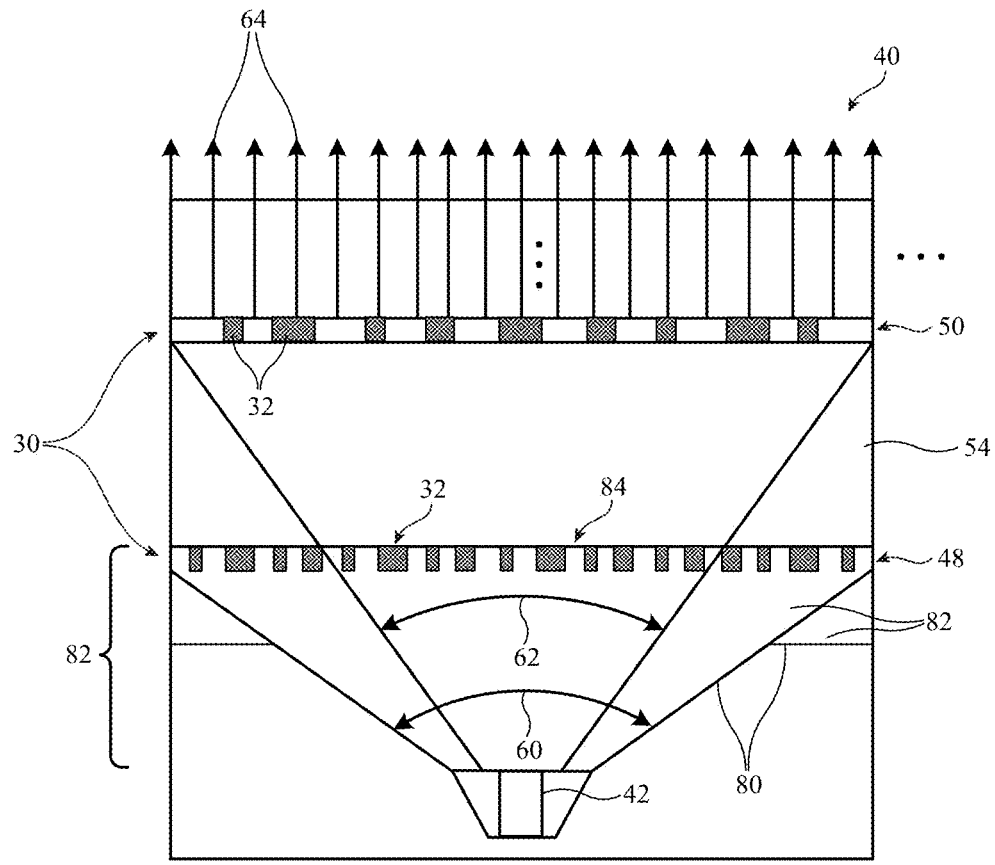
Figure 11:
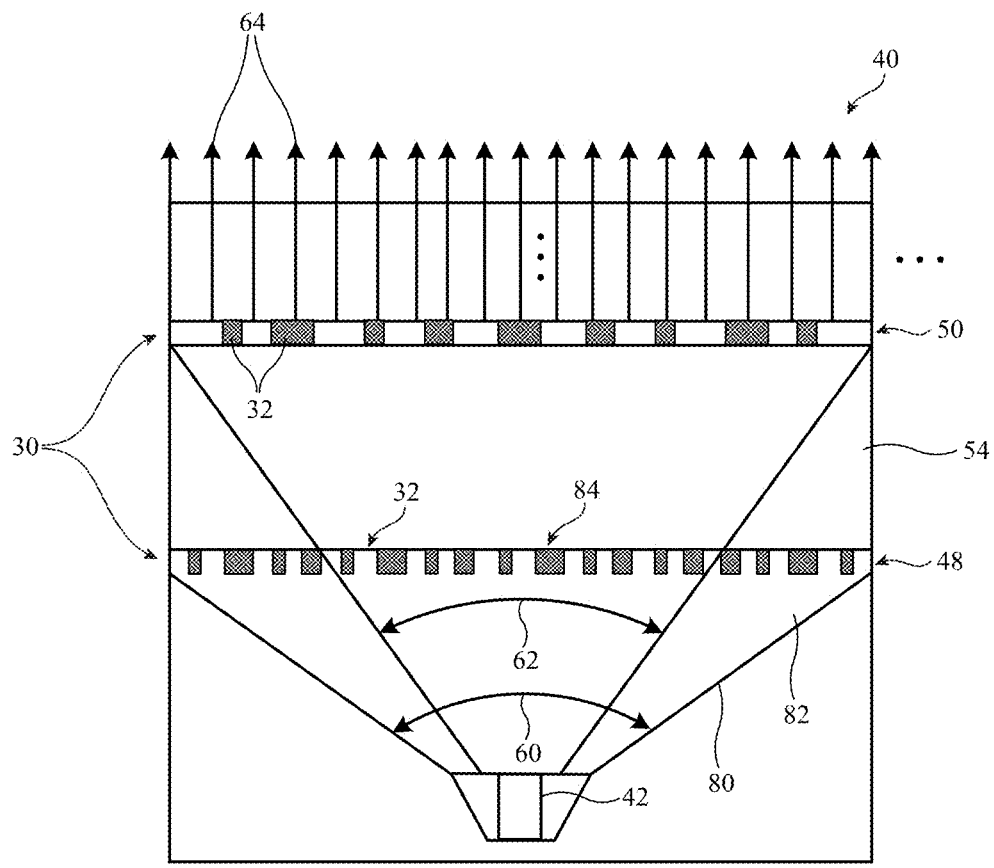

Consider, as an example, the arrangements of FIGS. 9, 10, and 11, in which component 40 is a display or other light-emitting device having an array of light sources 42 formed on surface 80 of semiconductor layer (semiconductor) 82. The portion of surface 80 in component 40 that is adjacent to each light source 42 may be planar (see, e.g., FIG. 9) or may have an angled and planar cross-sectional profile (FIG. 10) or an angled cross-sectional profile (FIG. 11) formed by etching or other fabrication techniques. Semiconductor layer 82 has nanostructures 32 on semiconductor surface 84, which is on the opposing side of layer 82 from surface 80.

Surface 84, which may sometimes be referred to as a backside surface during semiconductor processing operations, may be flipped to face outwardly following processing. In this orientation, light from light source 42 may be emitted through an array of multielement metalenses 30 as shown in FIGS. 9, 10, and 11.

In each multielement metalens 30, lens 50 may be formed from nanostructures 32 formed on the surface of layer 54 and may have a disk shape (e.g., a disk shape with a diameter equal to the diameter of lens 48 or less than lens 48 as described in connection with FIG. 8) and/or a ring shape. Nanostructures 32 in lens 48 may likewise be configured to form a metalens without any central opening as shown in FIGS. 9, 10, and 11) or a ring shape (see, e.g., FIG. 5). Arrangements of the type shown in FIGS. 9, 10, and 11 may be used with light-emitting components 40 (e.g., components with light sources 42) and/or may be used with light detecting components (see, e.g., component 40 of FIG. 6, which has an array of light detectors 70 aligned with respective multielement metalenses 30).

The foregoing is merely illustrative and various modifications can be made to the described embodiments. The foregoing embodiments may be implemented individually or in any combination.

What is claimed is:

1. An optical component, comprising:
   a light source; and
   a multielement metalens overlapping the light source that is configured to collimate light emitted by the light source, wherein the multielement metalens comprises a first metalens element having a first layer of nanostructures and a second metalens element having a second layer of nanostructures and wherein the first metalens element has a ring shape in which the first layer of nanostructures surrounds a circular region that is free of nanostructures.

2. The optical component defined in claim 1 wherein the light source comprises a light-emitting diode.

3. The optical component defined in claim 2 wherein the light-emitting diode is characterized by a coherence length of 1-3 microns and wherein the first and second layers of nanostructures comprise nanostructures with lateral dimensions of less than 0.4 microns.

4. The optical component defined in claim 1 further comprising a semiconductor layer, wherein the first metalens is formed on a first surface of the semiconductor layer and wherein the light source is formed on an opposing second surface of the semiconductor layer.

5. The optical component defined in claim 1 further comprising a layer of dielectric that separates the first layer of nanostructures from the second layer of nanostructures.

6. The optical component defined in claim 1 wherein the light source is configured to form a display pixel.

7. The optical component defined in claim 1, wherein the first metalens element is interposed between the second metalens element and the light source.

8. The optical component defined in claim 1, wherein a portion of the light emitted by the light source is collimated exclusively by the second metalens element.

9. An optical component, comprising:
a plurality of light detectors configured to form an image sensor; and
a multielement metalens configured to focus light onto a light detector of the plurality of light detectors, wherein the multielement metalens comprises a first metalens element having a first layer of nanostructures and a second metalens element having a second layer of nanostructures.

10. The optical component defined in claim 9 wherein the first and second metalens elements are uninterrupted by nanostructure-free openings.

11. The optical component defined in claim 10 further comprising a layer of dielectric that separates the first layer of nanostructures from the second layer of nanostructures.

12. The optical component defined in claim 9 wherein the first and second layers of nanostructures comprise nanostructures with lateral dimensions of less than 0.4 microns.

13. A display system, comprising:
an array of pixels each having a respective light-emitting device; and
an array of multielement metalenses each overlapping a respective pixel in the array of pixels, wherein at least one metalens element in the array of multielement metalenses has nanostructures of a first refractive index separated by material of a second refractive index and wherein a third material of a third refractive index overlaps the at least one metalens element.

14. The display system defined in claim 13 wherein each multielement metalens in the array of multielement metalenses has a first metalens element with a first layer of nanostructures overlapped by a second metalens element with a second layer of nanostructures.

15. The display system defined in claim 14 wherein the array of multielement metalenses comprises a semiconductor layer having opposing first and second surfaces.

16. The display system defined in claim 15 wherein the light-emitting devices comprise light-emitting diodes.

17. The display system defined in claim 16 wherein the light-emitting diodes are formed on the first surface and emit light that passes through the semiconductor layer and wherein the first layer of nanostructures is formed on the second surface.

18. The display system defined in claim 17 further comprising a dielectric layer between the first layer of nanostructures and the second layer of nanostructures.

19. The display system defined in claim 18 wherein the first and second layers of nanostructures comprise nanostructures with lateral dimensions of less than 0.4 microns.

20. The display system defined in claim 13 wherein each multielement metalens has a first metalens element with a first layer of nanostructures surrounding a nanostructure-free central region and has a second metalens element with a second layer of nanostructures that are uninterrupted by any nanostructure-free central region.

21. The display system defined in claim 20 wherein the light-emitting devices comprise crystalline semiconductor light-emitting diodes.

22. The display system defined in claim 13 wherein the nanostructures of the at least one metalens element have lateral dimensions of less than $\lambda/n$, where $\lambda$ is the operating wavelength of the light-emitting device and where n is the greater of the first and second refractive indices.

23. The display system defined in claim 13 wherein the nanostructures of the second at least one metalens element have lateral dimensions of less than $\lambda/n$, where $\lambda$ is the operating wavelength of the light-emitting device and where n is the third refractive index.

24. The display system defined in claim 13 wherein the nanostructures of the at least one metalens element have lateral dimensions of less than $1.5*\lambda/n$, where $\lambda$ is the operating wavelength of the light-emitting device and where n is the greater of the first and second refractive indices.

25. The display system defined in claim 13 wherein the nanostructures of the at least one metalens element have lateral dimensions of less than $1.5*\lambda/n$, where $\lambda$ is the operating wavelength of the light-emitting device and where n is the third refractive index.

\* \* \* \* \*

UNITED STATES PATENT AND TRADEMARK OFFICE
CERTIFICATE OF CORRECTION

| | | |
|---|---|---|
| PATENT NO. | : 12,153,233 B1 | Page 1 of 1 |
| APPLICATION NO. | : 17/465458 | |
| DATED | : November 26, 2024 | |
| INVENTOR(S) | : Xiaobin Xin et al. | |

It is certified that error appears in the above-identified patent and that said Letters Patent is hereby corrected as shown below:

On the Title Page

Right Column, Item (57), Line 12, "nanostructures arranged and" should read -- nanostructures and --

Signed and Sealed this
Fourth Day of February, 2025

Coke Morgan Stewart
*Acting Director of the United States Patent and Trademark Office*